United States Patent [19]

Keech

[11] Patent Number: 4,999,528

[45] Date of Patent: Mar. 12, 1991

[54] METASTABLE-PROOF FLIP-FLOP

[76] Inventor: Eugene E. Keech, 1830 E. Fairway Dr., #106, Orange, Calif. 92666

[21] Appl. No.: 436,425

[22] Filed: Nov. 14, 1989

[51] Int. Cl.$^5$ .................... H03K 3/356; H03K 19/003
[52] U.S. Cl. .................................... 307/279; 307/443; 307/272.2
[58] Field of Search .............. 307/443, 289, 353, 362, 307/272.2, 279, 491

[56] References Cited

U.S. PATENT DOCUMENTS

| | | | |
|---|---|---|---|
| 4,544,850 | 10/1985 | Tarleton | 307/272.2 |
| 4,642,484 | 2/1987 | Skovmand et al. | 307/362 |
| 4,686,391 | 8/1987 | Gudaitis | 307/362 |
| 4,689,497 | 8/1987 | Umeki et al. | 307/272.2 |
| 4,820,939 | 4/1989 | Sowell et al. | 307/272.2 |
| 4,929,850 | 5/1990 | Breuninger | 307/443 |

FOREIGN PATENT DOCUMENTS 0258515  11/1987  Japan ................. 307/272.2

*Primary Examiner*—John Zazworsky
*Attorney, Agent, or Firm*—William L. Chapin

[57] ABSTRACT

A clocked electronic flip-flop device which uses a novel method of storing digital data that is immune to metastability, regardless of data input level or timing, is disclosed. The method includes first converting the data input level to a stored voltage level which, in turn, is operably disconnected from its input source after the active transition of an external clock signal. In a preferred embodiment, the data input level is combined in an EXCLUSIVE OR circuit with the existing state of the flip-flop device to produce the stored voltage. The stored voltage is processed by a high-speed comparator which causes an internal clock pulse to be generated if and only if the amplitude of the stored voltage level exceeds a predetermined threshold level range. The internal clock pulse, if generated, is then used to toggle a conventional type flip-flop element comprising the output stage of the device into the opposite logic state. If the stored voltage level is too small to cause an internal clock pulse to be generated, it indicates that the data input signal level was not at the logic state which required a change of state. In either instance, the resultant state of the flip-flop device according to this invention is always proper for the given data input level and timing with respect to the active transition of the external clock input.

15 Claims, 5 Drawing Sheets

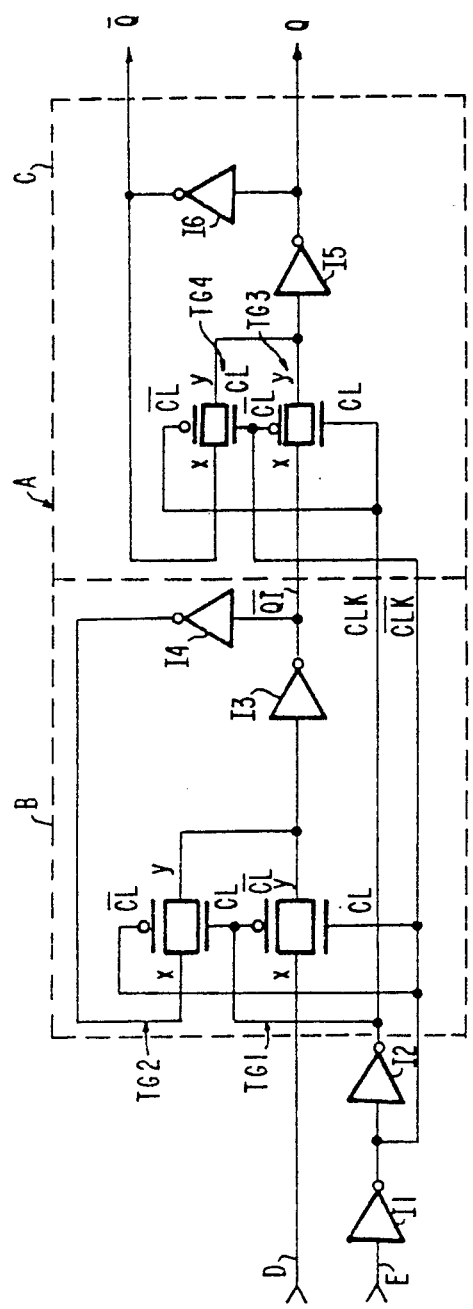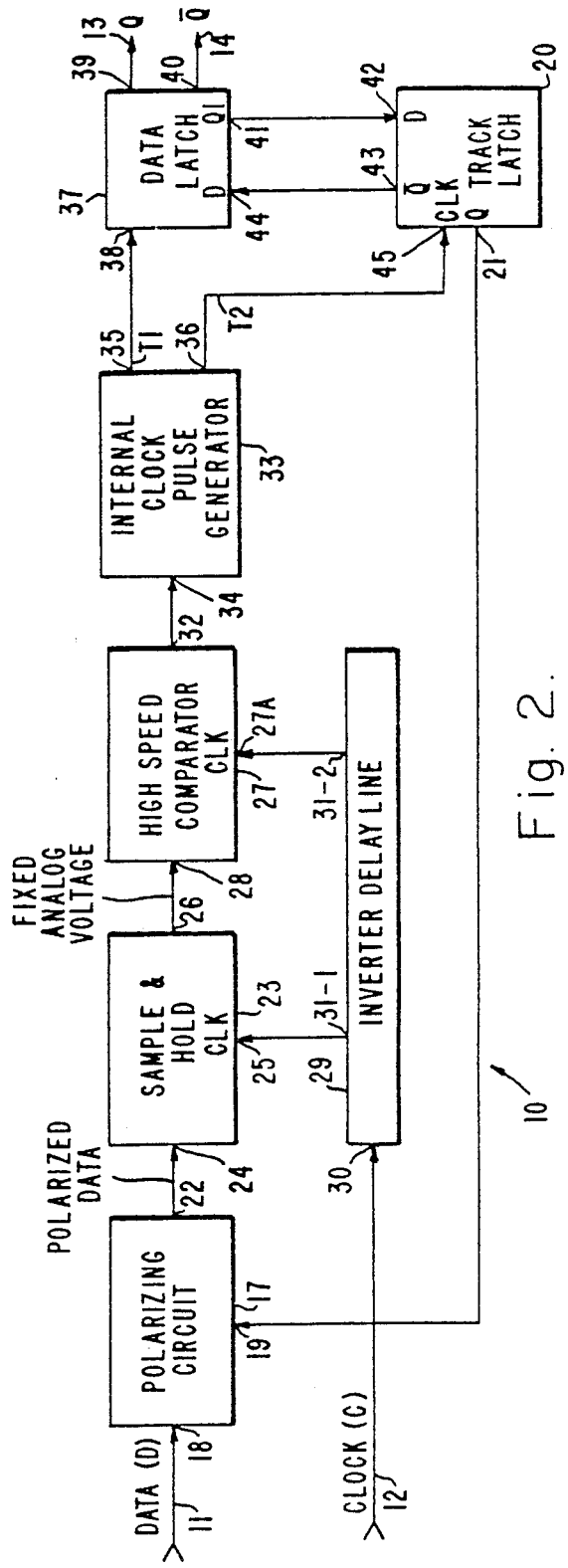

METASTABLE-PROOF FLIP-FLOP

BACKGROUND OF THE INVENTION

1. Field of the Invention

This invention relates to bistable electronic circuit elements. More particularly, the invention relates to an improved bistable multivibrator, or flip-flop, for use in computers and related digital systems. The improved flip-flop has a novel circuit architecture which precludes the occurrence of metastable states in the flip-flop.

2. Description of Background Art

Most computers and related digital electronic computational and control apparatus are based upon a binary number system, and therefore utilize binary logic elements. According to the rules of binary logic, elements of a digital computer may reside in only one of two possible states: a first, "high" or "logic one" state represented by a positive voltage, for example, and a second, "low" or "logic zero" state, represented by a different voltage. Typically, the logic zero state is represented by a smaller voltage, such as a zero or negative voltage.

Computers usually contain a large number of a few types of functional electronic building blocks known as logic gates. One such building block, known as an "AND" gate, outputs a logic one voltage level only if all of its input signal voltage levels are at logic one levels. An "OR" gate outputs a logic one voltage level at its output terminal if any of its input terminals is at a logic one level.

In addition to the logic gates described above, computers employ a large number of data storage or memory elements Storage elements are used to retain logic levels for relatively long periods of time. For example, bistable storage elements, i.e., storage elements having only two possible stable states, may be employed in the memory of a computer to hold a pattern of ones and zeros which are the binary number representation of a customer's name and address, or other such data.

Binary computers also employ a large number of bistable storage elements in their computational and control sections, in addition to those contained in the memory sections of the computer. Such bistable storage elements are generally used to retain logic levels for a relatively short period of time. Thus, a bistable storage element may be used to store a number representing an intermediate result of a sequence of computations. Bistable storage elements may also be used in the control functions of the computer, directing various operations to be performed based upon the memory of previous logic signal levels which are stored temporarily in one or more bistable storage elements.

One type of bistable logical building block, or functional module, used in large numbers in digital computers is a device referred to as a bistable multivibrator, bistable or flip-flop. Modern computers employ flip-flops comprised of circuit elements all residing as an integrated circuit on a single silicon chip. Silicon chips smaller than a fingernail may contain hundreds or even thousands of such flip-flops. Whatever the physical form taken by the flip-flop, it must perform essentially the same logic function. Specifically, the flip-flop must reside in either a logic zero or a logic one state, the particular state depending on the type of flip-flop and the type of signal logic level inputs previously presented to the flip-flop.

Some rudimentary flip-flops, referred to as asynchronous latches, are designed to change output state whenever a particular input terminal changes from a logic zero to a logic one level, or vice versa. Most flip-flops, however, are designed to operate synchronously. A synchronous flip-flop requires a clock signal for its operation. Usually, the clock signal is continuously applied to the clock input terminal of the flip-flop, and changes logic states of the flip-flop at regular, precisely determined time intervals, to a state corresponding to a logic level applied to a data input terminal of the flip-flop.

In a synchronous flip-flop, a one or zero logic input level is first applied to the data input terminal of the flip-flop, depending on whether it is desired to set the flip-flop to a one output level, or reset it to a zero output level. Then, when the clock signal at the clock input terminal makes a predetermined transition, or logic level change, the logic level at the data input terminal of the flip-flop is copied into the flip-flop; causing the flip-flop output terminal to change to a desired memory state, in synchronization with the clock signal level transition.

Clocked flip-flops of the type described above are all made up of circuit elements in which signals are propagated at finite velocities. Therefore, conventional flip-flops require data input signal levels to reside at a data input terminal a minimum time interval before the clock signal transition occurs. That minimum time interval is referred to as the setup time. Also, the data input signal must remain at the desired logic level for a minimum duration known as the hold time.

If either or both the setup or hold-time requirements for a particular clocked flip-flop of the conventional prior art-type are violated, the flip-flop may assume an undesirable state which is referred to as a metastable state. The metastable state is characterized by a signal level at an output terminal of the flip-flop pausing at an amplitude intermediate between the logic one and logic zero levels characteristic of a properly operating flip-flop, and then falling back to the previous logic level, rather than switching completely. Logic gates, flip-flops and other digital-system building blocks to which the output terminals of a flip-flop may connect, all require that the level of a signal on an input terminal of the device be above a first, "high" threshold voltage for that signal to be recognized as a logic one signal. Similarly, all such functional building blocks required that a signal at an input terminal be below a second "low" threshold voltage to be recognized as a logic zero level. Therefore, an intermediate signal amplitude level, between the high and low threshold voltages, at the output terminal of a flip-flop in a metastable state causes the output states of a functional building block whose input terminal is connected to the flip-flop to be unpredictable.

The failure of a metastable flip-flop to achieve a known logic state upon the active transition of the clock input signal can cause unacceptable errors in the operation of digital systems. In particular, the partial switching of the output level of a metastable flip-flop can produce an undesirable pulse of short duration called a "runt" pulse or "glitch", which may propagate partially or fully through downstream logic building blocks. Also, an indeterminate delay in the return of the output signal level of a metastable flip-flop to its original state can cause system errors.

Any of the results of a flip-flop entering a metastable state described above can cause severe operational problems in a digital system. Such problems usually result in failure of an operating computer program, requiring a full system reset and restart for the program to run correctly to its conclusion.

Problems resulting from metastable operation of flip-flops, referred to in the industry as "metastability," are most frequently encountered when data or control signals are generated asynchronously with respect to the internal clock of the computer or other digital system. Such asynchronous signals can be generated in a variety of sources external to the computer, such as auxiliary equipment referred to as "peripherals" and including printers, other computers, and other such devices.

A recognition of the metastability problem existing in prior art flip-flops has prompted a number of proposed solutions to the problem. Examples of the proposed solutions are contained in the following U.S. patents:

East, et al., U.S. Pat. No. 3,761,739, Sept. 25, 1973, Non-Metastable Asynchronous Latch: Describes an asynchronous latch employing a tunnel diode to prevent the latch from entering a metastable state.

Paschal, et al., U.S. Pat. No. 4,093,878, June 6, 1978, De-Glitchable Non-Metastable Flip-Flop Circuit. Discloses a flip-flop which incorporates a Schmitt trigger as a thresholding device, and a resistor capacitor integrator circuit for the purpose of preventing the flip-flop from producing glitches or entering a metastable state.

DeRienzo, U.S. Pat. No. 4,282,489, Aug. 4, 1981, Metastable Detector. Discloses a detector circuit employing a substantial number of active logic building blocks and passive integrator elements for monitoring the complementary outputs of an operating flip-flop, and producing a signal indicating when those outputs have reached a defined stable state.

Leslie, U.S. Pat. No. 4,575,644, Mar. 11, 1986, Circuit For Prevention Of The Metastable State In Flip Flops. Discloses a "synchronizing" circuit for use with a clocked flip-flop having an asynchronous input signal. The circuit is reported to reduce the duration of, or inhibit, the metastable condition of an output terminal of the flip-flop by injecting an oscillator signal of higher frequency into the complementary output terminal of the flip-flop.

Campbell, U.S. Pat. No. 4,591,737, May 22, 1986, Master-Slave Multivibrator With Improved Metastable Response Characteristic. Discloses a master-slave flip-flop device in which the master flip-flop employs an extra driver transistor in each of the two logic gates comprising the master latch, for isolating function and load outputs of the gates, for the intended purpose of minimizing the duration of the undesirable metastable state of the master segment, thereby enhancing the propagation speed in which a stable state is established.

Whitely, U.S. Pat. No. 4,622,475, Nov. 11, 1986, Data Storage Element Having Input And Output Ports Isolated From Regenerative Circuit. Discloses a data storage element having input and output ports isolated from a regenerative latch portion so that the data transmission path is not through the latch. The stated purpose of the circuit arrangement is to "greatly reduce the probability of metastable occurrence."

The present invention was conceived of in response to a perceived need for a clocked bistable logic element or flip-flop in which the output signals are totally free of any metastable state, regardless of the data input signal pulse polarity, duration, or time relationship to the clock signal.

OBJECTS OF THE INVENTION

An object of the present invention is to provide a bistable electronic logic element free of any metastable output states.

Another object of the invention is to provide a bistable multivibrator (flip-flop) of the clocked or synchronous variety which does not display any metastable output states, regardless of the time relation between the level change of data input signals and the level change of a clock signal applied to the flip-flop.

Another object of the invention is to provide a metastable-proof flip-flop which may be implemented in a wide variety of electronic logic families.

Another object of the invention is to provide a metastable-proof flip-flop which may be constructed of all bipolar elements on a monolithic chip.

Another object of the invention is to provide a metastable-proof flip-flop which may be constructed of CMOS (Complementary Symmetry Metal Oxide Semiconductor) and bipolar elements, on the same chip, or combination of chips.

Various other objects and advantages of the present invention, and its most novel features, will become apparent to those skilled in the art by perusing the accompanying specification, drawings and claims.

It is to be understood that although the circuits disclosed herein are fully capable of achieving the objects and providing the advantages described, the embodiments of the invention described herein are merely illustrative of specific means to implement the novel architecture of this invention. Accordingly, I do not intend that the scope of my exclusive rights and privileges in the invention be limited to the details of the embodiments described. I do intend that equivalents, adaptations and modifications of the embodiments reasonably inferrable from the descriptions contained herein be included within the scope of the invention as defined by the appended claims.

SUMMARY OF THE INVENTION

Briefly stated, the present invention comprehends a bistable, clocked or synchronous electronic flip-flop device having a unique circuit architecture which precludes the possibility of the flip-flop having any metastable output states, independent of the polarity, amplitude or duration of data input signals, or their time relationship to the external clock signal applied to the flip-flop.

This metastable-free operation is accomplished by a novel circuit architecture which performs the data signal processing steps of (a) logically gating input data to produce a predetermined voltage level only if the input data logic level is different than the existing logic level of the novel flip-flop device output, (b) storing the resultant voltage level in a "sample-and-hold" device which is disconnected from the input source immediately after the active edge of the external clock, then (c) generating an internal data clock only if the stored voltage level is sufficiently near a predetermined threshold level to indicate that the input logic level is different from the present logic level of the device, and (d) using the internal data clock to toggle a pair of bistable elements in a toggle configuration which then always reflects the correct state as driven by the input data but having no exposure whatsoever to data input irregularities of amplitude and/or timing which contribute to metastability in conventional flip-flop devices of the prior art.

Thus, the novel flip-flop device according to the present invention uses a unique architecture to achieve freedom from metastable operation by the novel method of functionally isolating three problem areas affecting all flip-flops, by means of three separate circuits which are sequentially enabled. The three distinct problem areas are: (1) ambiguous direction of change of state, (2) infinitely variable time and rate fluctuations of the input data signal, and (3) unknown amplitude of input voltage representing "change." These three problem areas are sequentially handled by the following circuit elements:

1. A data polarity circuit, which determines the direction of change of state, if any, which the flip-flop device output stage should experience, by use of a logic block which performs an EXCLUSIVE OR function and has one input terminal connected to the device input terminal and a second input terminal connected to the device output terminal, 2. A sample-and-hold circuit connected to the output of the data polarity circuit, which establishes a stored voltage proportional to the data input signal level amplitude, timing and direction prior to an active clock transition, thus eliminating the effects of any signal level or timing variations subsequent to the active clock transition, and 3. A novel high-speed comparator connected to the output or the sample-and-hold, which uses a variable reference voltage within the "indeterminate" range between logic one level and logic zero level to provide accelerated loop gain by which to rapidly resolve the voltage from the sample-and-hold circuit into a full-amplitude internal clock pulse only if the input voltage is at least above the logic zero level. Thus, the novel high-speed comparator resolves the third problem area by transforming an unknown voltage level into a specific full-strength digital pulse or else no output at all, then using the pulse, if generated, to clock two conventional bistable elements configured, as a conventional toggle flip-flop.

It should be emphasized that the sample-and-hold circuit performs a unique action in the novel metastable-proof flip-flop device of this invention. It stores a voltage which is proportional to all information which signifies whether a logic one or logic zero should be transmitted to the output pins of the overall flip-flop device. In other words, the input data level itself plus all of its variances within the "setup and hold" time period near the active clock transition are literally summarized into a single stored voltage.

Thus, once separated from all influence of time and rate fluctuations of the input data level and its timing relationship with the clock signal, the voltage stored in the sample-and-hold functional block constitutes a fixed voltage proportional to "requirement to change." For example, say if logic one were to represent the "requirement to change" in a particular embodiment of this invention, the closer the voltage approached full logic one level, the higher the requirement to change; conversely, the closer the voltage approached logic zero level, the lower would be the requirement to change. From this point, the comparator circuit would make a rapid transformation of a sufficiently high sampled voltage into a full amplitude clock pulse to toggle the conventional flip-flop mechanism.

It is important to note here that, although the input voltage level is logically gated through an EXCLUSIVE OR gate prior to being stored, and the generation of an internal clock pulse causes the two bistable elements to toggle in conventional flip-flop fashion, the resultant logic state of the metastable-proof flip-flop will always correspond directly with any given data input at the time of the active transition of the clock, just as is required of a flip-flop of the prior art.

This is due to the generation of the internal gated voltage from a direct logic reference to the existing output logic state and also the fact that clock generation and subsequent toggling of the bistable elements is always caused by the coincidence of a data input level that is the opposite of the output logic level. Therefore, toggling the bistable elements always causes the output level of the device to come into agreement with the data input level of the device. Conversely, if an inadequate voltage occurs at the output of the sample-and-hold circuit, no clock signal will be outputted from the comparator. In this case, the logic state of the flip-flop device will not change, inasmuch as the output logic level of the device already agrees with the logic level of the external data input terminal.

Note also, that the toggle flip-flop is constructed of two bistable elements configured as a conventional toggle flip-flop, with its own complementary output being connected to its own data input terminal. Therefore, the toggle flip-flop has no exposure whatsoever to any metastable levels or timing anomalies which might exist at the external data input terminal to the novel metastable-proof flip-flop device of this invention. Thus, the revolutionary architecture and unique signal flow enables the novel metastable-proof flip-flop device to achieve its total immunity from the factors which produce metastable outputs from conventional flip-flops designed according to the prior art.

BRIEF DESCRIPTION OF THE DRAWINGS

FIG. 1 is a schematic diagram of a typical prior art D-type clocked, or synchronous flip-flop.

FIG. 2 is a functional block diagram of a novel metastable-proof flip-flop device according to the present invention.

DETAILED DESCRIPTION OF THE INVENTION

Figure 3:
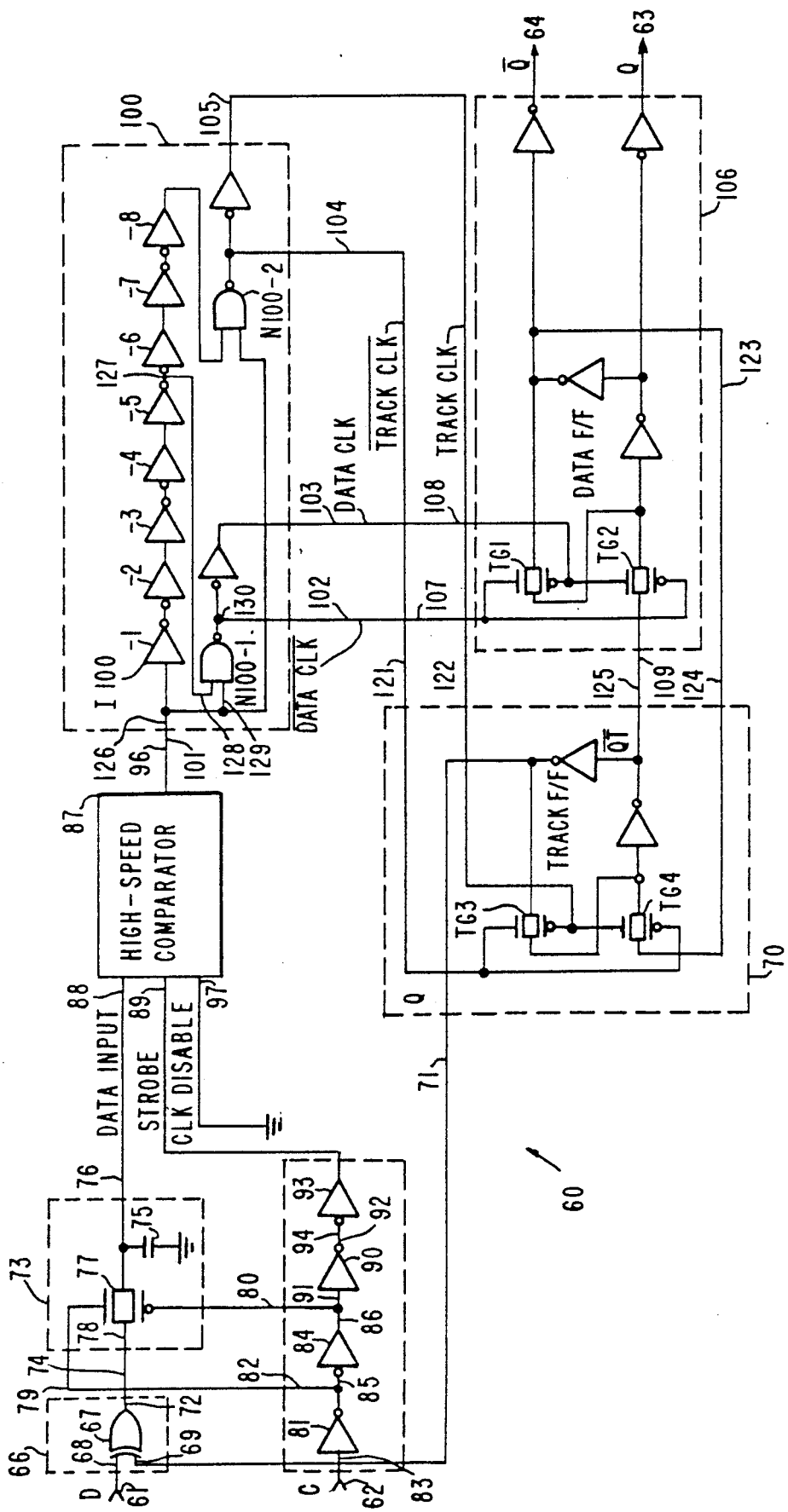
FIG. 3 is a schematic diagram of one circuit embodiment of the novel flip-flop device of FIG. 2.

A. Prior Art Example.

An understanding of the structure and function of the novel metastable-proof flip-flop according to the present invention may be facilitated by the following description of a typical prior art flip-flop.

Referring now to FIG. 1, a conventional clocked, or synchronous, D-type master-slave flip-flop constructed from CMOS (Complementary Symmetry Metal Oxide Semiconductor Transistors) logic elements or building blocks is shown.

In addition to standard logic inverters, the flip-flop of FIG. 1 uses a CMOS building block referred to as a transmission gate, TG.

As depicted in FIG. 1, each transmission gate, TG, e.g., TG1, has a clock input terminal CL, an inverted clock input terminal $\overline{CL}$, a first input/output terminal X, and a second, identical input/output terminal Y. The input/output terminals X and Y are functionally interchangeable. When the clock input terminal CL of a transmission gate is at a logic one level, and the inverted clock input terminal $\overline{CL}$ is at a logic zero level, a low-impedance, bi-directional path is created between I/0 terminals X and Y, for both logic one and logic zero level signals. Thus, for this condition, a transmission gate TG is in an "ON" state.

When the clock input terminal CL of a transmission gate TG is at a logic zero level, and the inverted clock input terminal $\overline{CL}$ is at logic one level, a high impedance, or "OFF" state exists between I/0 terminals X and Y, thus isolating circuits connected to terminals X and Y from one another. As shown in FIG. 1, the exemplary prior art flip-flop A is a D-type, clocked, master/slave flip-flop having a master flip-flop subsection B and a slave flip-flop subsection C. Data is inputted to the flip-flop A in the form of a logic one or zero level on the input terminal D of master flip-flop B.

Consistent with the functional operation of transmission gates TG as described above, the following conditions prevail during the low, or inactive state of the clock signal at the clock input terminal E of the flip-flop A: Transmission gates TG2 and TG3 are in an off, or high impedance state, while transmission gates TG1 and TG4 are in an on, or low impedance state. During the high, active clock state, TG2 and TG3 are on, while TG1 and TG4 are off.

With input transmission gate TG1 of master flip-flop B on, signals at the data input terminal D of the flip-flop A are conducted directly through TG1 to the input terminal of inverter I3, and hence appear in inverted form at the output terminal of inverter I3, which also constitutes the inverted output, $\overline{QI}$, of the master flip-flop B. The output terminal of inverter I3 is also connected to the input terminal of inverter I4. Thus, the signal level at the output terminal of inverter I4, which experiences two logic inversions in traversing cascaded inverters I3 and I4, is at the same logic level, one or zero, as that of the data input signal on data input terminal D.

The output terminal of inverter I4 is connected to the input terminal of feedback transmission gate TG2, whose output terminal is connected back to the input terminal of inverter I3. When the clock input signal makes a low-to-high level change, input transmission gate TG1 is turned off, disconnecting the data input terminal D from the master flip-flop B, preventing any signal level changes on the data input terminal from having any effect upon the flip-flop 11 during the high or active state of the clock.

A low-to-high level transition of the clock input signal on clock input terminal E also turns on feedback transmission gate TG2. With TG2 on, the output terminal of inverter I4 is connected to the input terminal of inverter I3. Since the logic level of the output of inverter I4 is the same as the logic level at the input of inverter I3, a regenerative feedback path exists between the output and input ports of cascading inverting amplifier I3 and I4 when feedback transmission gate T2 is in a low impedance, on state. Thus, the signal level at the input terminal of inverter I3 is latched into the series loop comprised of I3, I4, TG2 and I3, when TG2 is turned on. Therefore, the signal level at the data input terminal D just prior to the low-to-high clock transition is latched into master flip-flop B upon the occurrence of the low-to-high clock transition. The latched-in signal level appears in inverted form at the output terminal $\overline{QI}$ of master flip-flop B, and will remain latched there as long as the clock level is high.

It should be noted here that the ideal performance of the master flip-flop B described above may not always be realized in actual operating systems. For example, if a data input signal pulse at the data input terminal D of the flip-flop is of insufficient width or amplitude, or has a transition edge occurring too closely in time to the low-to-high clock transition, the desired signal level may not be latched into the master flip-flop, or the $\overline{QI}$ output of the master flip-flop may temporarily fluctuate up and down at indefinite voltage levels, a condition referred to as a metastability.

Turning now to a description of the slave flip-flop C forming part of D-type flip-flop A, it may be noted from FIG. 1 that the structure, and hence function, of the slave flip-flop are substantially identical to that described above for master flip-flop B. However, the drive signals for the transmission gates TG3 and TG4 of the slave flip-flop are inverted from the drive signals for transmission gates TG1 and TG2 of the master flip-flop, by means of inverters I1 and I2. Therefore, the clock signals and operation of transmission gates TG3 and TG4 of the slave flip-flop C are inverted 180 degrees from those of the corresponding transmission gates TG1 and TG2 of the master flip-flop.

Thus, during the high, active clock state, input transmission gate TG3 of slave flip-flop C is turned on, transferring the signal level at the $\overline{QI}$ output of master flip-flop B to the input terminal of inverter I5. Output terminal Q of slave flip-flop C, which is also the output terminal of overall master/slave flip-flop A, is connected to the output terminal of inverter I5. Therefore, during the active clock state, the output terminal of the slave flip-flop C is at the same level as that copied into master flip-flop B from data input terminal D, when the master flip-flop latched upon occurrence of the low-to-high clock transition.

When the clock makes a high-to-low transition, input transmission gate TG3 of slave flip-flop C is turned off, and feedback transmission gate TG4 turned on, latching the signal level at the $\overline{QI}$ output terminal of the master flip-flop B into the slave flip-flop C, making the logic level originally present on data input terminal D available at the Q output terminal of the slave flip-flop C, and M/S flip-flop A.

For clock rates which are sufficiently high, metastable signal levels at the $\overline{QI}$ output terminal of the master flip-flop might still be present at the slave flip-flop input terminal at the time of a high-to-low clock transition, also making the output level of the slave flip-flop subject to unpredictable changes for certain conditions of data input signal levels, pulse widths, and time relationship to the clock signal. Metastable output states may also occur in the slave flip-flop soon after the low-to-high transition of the clock, regardless of the clock rate, if the master flip-flop fluctuates at this time.

B. Description of the Basic Embodiment. FIG. 2 is a functional block diagram showing the fundamental elements of a basic embodiment 10 of a novel metastable-proof flip-flop device according to the present invention. FIG. 3 is a schematic diagram of the flip-flop device shown in FIG. 2.

As shown in FIG. 2, the metastable-proof flip-flop device 10 includes the customary data input, D, terminal (11), clock input, C, terminal (12), data output, Q, terminal (13), and inverted data output, $^-$Q terminal (14). Thus, the novel flip-flop 10 has, from an external viewpoint of input/output signals, the configuration of a conventional D-type flip-flop.

The example embodiment of the invention to be described, and depicted in FIGS. 2 and 3, is intended as an improved replacement for D-type, clocked, or synchronous, flip-flops. Those skilled in the art will of course recognize that the novel metastable-proof flip-flop according to the present invention could also be configured as a J-K flip-flop, or other type of flip-flop, while still affording the freedom from metastability made possible by the novel circuit architecture of the flip-flop design according to the present invention.

As shown in FIG. 2, the novel metastable-proof flip-flop device 10 according to the present invention includes a data polarity circuit block labelled Polarizing Circuit, 17. The polarizing circuit 17 has a first input terminal 18 connected to data input terminal 11 of flip-flop device 10. Also, polarizing circuit 17 has a second input terminal 19 which is connected to the output terminal 21 of a track flip-flop or latch 20, about which more will be said later.

The function of the polarizing circuit 17 is to produce at its output terminal 22 a logic one level if and only if the logic levels at the input terminals 18 and 19 of the polarizing circuit differ from one another. Thus, the transfer function of the polarizing circuit is the same as that of the logic element known as an EXCLUSIVE OR (XOR) gate.

The output terminal 22 of the polarizing circuit 17 is connected to the data input terminal 24 of a sample-and-hold circuit 23. Sample-and-hold circuit 23 also has a clock input terminal 25, and an output terminal 26.

The function of the sample-and-hold circuit 23 is to copy or sample the signal level on its data input terminal 24 into an internal storage capacitor during the low or inactive state of the clock signal which is applied to its clock input terminal 25, and to retain that level for a finite period of time, while ignoring any input signal level fluctuations which may occur on its data input terminal 24 after the clock signal makes a low-to-high or active transition.

The output terminal 26 of sample-and-hold circuit 23 is connected to the input terminal 28 of a high-speed comparator 27.

The sample-and-hold circuit 23 and high-speed comparator 27 function in combination to determine whether a data signal on the input terminal 11 of flip-flop device 10 meets amplitude and timing criteria for the flip-flop device to recognize the XOR output signal as a logic one. In making that determination, these two circuits utilize timing signals produced by delay line 29. Delay line 29 has an input terminal 30 connected to the clock input terminal 12 of the flip-flop device 10. Preferably, delay line 30 is comprised of a series of logic inverters, the output terminals, 31-1 and 31-2 of which produce a sequence of signals delayed by one or more gate propagation delays from one another, when a clock pulse occurs on the input terminal of the delay line. These output terminals are connected to the clock input terminal 25 of sample-and-hold circuit 23, and to clock input terminal 27A of high-speed comparator 27, respectively.

High-speed comparator 27 will rapidly produce a zero-to-one logic level transition at its output terminal only if the voltage on the sample-and-hold capacitor exceeds a pre-determined threshold voltage range at the time the amplifier circuit is strobed by the delayed clock pulse coming from the delay line 29.

The output terminal 32 of high-speed comparator 27 is connected to the input terminal 34 of an internal clock pulse generator 33. The internal clock pulse generator 33 functions as a monostable multivibrator, or one-shot, with an additional cascaded delay stage. Thus, internal clock generator 33 produces a single pulse T1, on a first output terminal 35 and a slightly delayed pulse T2, on a second output terminal 36, only if a zero-to-one transition occurs on output terminal 32 of high-speed comparator 27.

First output terminal 35 of the clock pulse generator 33 is connected to the clock input terminal 38 of a "data" latch or flip-flop 37. The Q output terminal 39 and $\overline{Q}$ output terminal 40 of data latch 37 comprise the Q data output terminal 13 and $\overline{Q}$ data output terminal 14, respectively, of flip-flop device 10. Data latch 37 has an internal, unbuffered QI data output terminal 41, which is connected to the D, data input terminal 42 of tracking latch 20. The $\overline{Q}$ data output terminal 43 of tracking latch 20 is in turn connected to the D, data input terminal 44 of data latch 37. Tracking latch 20 also has a clock input terminal 45 connected to a second output terminal 36 of the internal clock pulse generator 33.

If a logic signal appears on the data input terminal 11 of flip-flop device 10 which has a different polarity than the logic level residing at Q data output terminal the tracking latch 20, a logic one signal will appear at output terminal 22 of the polarizing circuit 17. (Note that the logic level of Q data output terminal 21 of tracking latch 20 is always the same as the logic level of Q data output terminal 13 of flip-flop device 10 just prior to the active transition of the external clock signal.) If the data input signal on input terminal 11 of flip-flop device 10 is of sufficient amplitude and pulse width duration before the occurrence of an active level transition of the external clock signal applied to clock input terminal 12 of flip-flop 10, a time delayed zero-to-one transition will occur at output terminal 32 of high-speed comparator 27, as was described above.

The occurrence of a zero-to-one logic level transition at output terminal 32 of high-speed comparator 27, which terminal is connected to input terminal 34 of clock pulse generator 33, causes a first internal clock pulse to appear at first clock output terminal 35 of the clock pulse generator, clocking the inverted contents of the tracking latch into the data latch. Since the logic state of tracking latch 20 was initially the same as the logic state of data latch 37, as explained above, and always tracks the logic level of the data latch, as will be explained below, the logic state of data latch 37 is changed, or toggled, if and only if internal clock pulse generator 33 is activated.

Immediately after the occurrence of a first clock pulse on first output terminal 35 of clock pulse generator 33, a second, delayed pulse occurs on second output terminal 36 of the clock pulse generator. Second clock pulse output terminal 36 is connected to the clock input terminal 45 of tracking latch 20. Since D data input terminal 42 of the tracking latch 20 is connected to QI data output terminal 41 of data latch 37, the new logic level of the data latch is copied into the tracking latch upon occurrence of the second internal clock pulse. Thus, after the occurrence of the second, delayed clock pulse produced by internal clock pulse generator 33, flip-flop device 10 is returned to a second state, preparatory to receipt of the next periodic external clock pulse signal on clock input terminal 12, which may or may not be preceded by a data input signal on data input terminal 11 of the flip-flop device.

The functional operation of the novel metastable-proof flip-flop device 10 depicted in FIG. 2 and described above may be summarized as follows:

(1) Input data is polarized by logic circuits which reference the last-captured state of the data input as reflected in the state of the data flip-flop prior to the active edge of the clock signal. This creates a modified data input signal which will be high, or logic one, if and only if the data input is such that it would be expected to cause the output state to change.

(2) A sample-and-hold capacitor is charged by the modified data input signal outputted by the data polarizing circuit and is caused to enter a "hold" state upon the occurrence of the active transition of the clock. The fixed sample-and-hold capacitor voltage contains the summarized results of any possible set of data input voltage and timing conditions with respect to the clock signal. The sampled voltage, therefore, will be closest to a logic one level if set up and hold times are met with adequate levels of that data which should cause an output change, and will be proportionately lower according to all timing violations and level inadequacies.

(3) A novel high-speed comparator resolves the sampled voltage into a clean, full transition to a logic one level if and only if the sampled voltage exceeds a predetermined threshold voltage range. Otherwise, the output terminal of the high-speed comparator remains at logic zero. The design of the comparator is such that any input voltage, no matter how close to the exact "decision point" between output or no output, will cause the output voltage of the comparator to experience a full transition to a logic one level, or remain at a logic zero level.

(4) An internal clock generator connected to the comparator generates an internal clock pulse sequence to toggle the output latch of the flip-flop device if and only if a logic one output is generated by the comparator. Thus, it may be seen that input data having only minor deviations in setup, hold time and logic amplitude requirements will still cause the output stage of the novel flip-flop device to toggle. Conversely, given excessive setup or hold time variations and/or the same logic level as already captured on the previous active clock edge, no internal clock pulse sequence will be generated. In other words, if the output doesn't need to be altered, no internal clock pulses are needed or generated.

As described above, the novel flip-flop device according to the present invention transforms the input data signal prior to and during the active edge of the clock into an analog voltage proportional to "requirement to change." Then, the comparator creates a full logic output transition which produces internal clock pulses to toggle the output stage if and only if the analog voltage exceeds a preset minimum value. Of particular importance is the fact that the output stage is independent of input data as a basis of its change to the next state; it uses the pre-established full logic level which is the basis for polarizing input data. Therefore, the output stage will make a change to the opposite state entirely free from any metastable state if an internal clock is generated, and no change in the absence of the internal clock pulse.

FIG. 3 is a schematic diagram of a basic embodiment 60 of the novel metastable-proof flip-flip device according to the present invention. The flip-flop device 60 is constructed largely of CMOS electronic logic elements, and interconnected substantially in accordance with the interconnection of elements of flip-flop device 10 shown in block diagram form in FIG. 2 and described above.

Referring now to FIG. 3, the basic embodiment 60 of the novel metastable-proof flip-flop device according to the present invention is seen to include a data input (D) terminal 61, and an external clock input (C) terminal 62. The flip-flop 60 also includes a data output (Q) terminal 63 and an inverted data output ($\overline{Q}$) terminal 64.

Flip-flop device 60 includes a data polarizing circuit 66 consisting of an EXCLUSIVE OR (XOR) gate 67. The XOR gate 67 has a first data input terminal 68 connected to data input terminal 61 of flip-flop device 60. Also, XOR gate 67 has a second input terminal 69 connected to the output terminal 71 of a track flip-flop 70, the function of which will be described later. XOR gate 67 produces at its output terminal 72 a logic one level if and only if the logic levels of the input terminals 68 and 69 of the gate differ from one another.

Output terminal 72 of XOR gate 67 is connected to the data input terminal 74 of a sample-and-hold circuit 73. Sample-and-hold circuit 73 preferably consists of a storage capacitor 75 having a capacitance in the range of approximately one-half picofarad to four picofarads. One terminal of capacitor 75 is connected to ground. The other terminal of capacitor 75 is connected to the output terminal 76 of sample-and-hold circuit 73, and to a second input/output terminal 76 of a transmission gate 77. The first input/output terminal 78 of transmission gate 77 is connected to input terminal 74 of sample-and-hold circuit 73.

Transmission gate 77 has a clock input control gate 79 and an inverted clock input control gate 80. Clock input control gate 79 of transmission gate 77 is connected to the output terminal 82 of a first external clock inverter 81, the input terminal 83 of which inverter is connected to external clock input terminal 62. A second clock inverter 84 has its input terminal 85 connected to output terminal 82 of first clock inverter 81, and its output terminal 86 connected to inverted clock input terminal 80 of transmission gate 77.

When the external clock signal is in its low, or inactive state, transmission gate 77 is in a low-impedance, on state, connecting output terminal 72 of XOR gate 67 to sample-and-hold capacitor 75. When the external clock signal makes a transition from a low to high, or active state, transmission gate 77 is switched off, disconnecting the sample-and-hold capacitor from the XOR gate. Therefore, sample-and-hold circuit 73 "copies" or samples the signal level at output terminal 72 of XOR gate 67, transferring that level onto capacitor 75 during the low or inactive state of the external clock signal, and retains that level for a finite period of time. Sample-and-hold circuit 73 is unresponsive to any input signal level fluctuations which may occur on its input terminal during the high or active state of the external clock, since transmission gate 77 is then in a high-impedance, off state.

Output terminal 76 of sample-and-hold circuit 73 is connected to the input terminal 88 of high-speed comparator 87. High-speed comparator 87 also has a strobe input terminal 89. Strobe input terminal 89 is connected to the output terminal of a series of two inverters connected to the output terminal 86 of second external clock inverter 84. Thus, as shown in FIG. 3, a third external clock inverter 90 has an input terminal 91 connected to the output terminal 86 of second external clock inverter 84, and an output terminal 92 connected to the input terminal 94 of a fourth external clock inverter 93. The output terminal of the fourth inverter 93 is connected to strobe input terminal 89 of comparator 87. Thus, the signal at strobe input terminal 89 of high-speed comparator 87 is a replica of the external clock input signal, but delayed by an interval equal to the sum of the gate propagation delays of inverters 81, 84, 90 and 93.

Comparator 87 has an "internal clock output" terminal 96 and an internal clock disable input terminal 97. In the circuit of FIG. 3, internal clock disable terminal 97 is permanently connected to ground, and therefore, inactive.

The function of comparator 87 is to produce at its internal clock output terminal 96 a zero-to-one logic level transition only if the voltage on sample-and-hold capacitor 75 exceeds a pre-determined threshold voltage range at the time the comparator is strobed by a delayed zero-to-one external clock input pulse occurring at strobe input terminal 89 of the comparator 87. In novel metastable-proof flip-flop 60, it is essential that comparator 87 produce, if at all, a solid zero-to-one logic level transition at its output terminal 96 within the rated minimum clock period of the particular logic family from which the device is made. Thus, the transition at output terminal 96 of comparator 87 must occur sufficiently early to propagate through a data flip-flop 106, which will be described below, to the output pins of flip-flop device 60 prior to the next active edge of the external clock signal applied to external clock input terminal 62. The specific time, in nanoseconds, that the output of the comparator lags the strobe input depends entirely on the technology in which a particular metastable-proof flip-flop device is implemented. The novel design of comparator 87, shown in detail in the schematic diagram of FIG. 4 and described in detail below, achieves the high speed determination of whether the data input voltage should be recognized as a logic one level when compared with a variable reference voltage.

Figure 4:
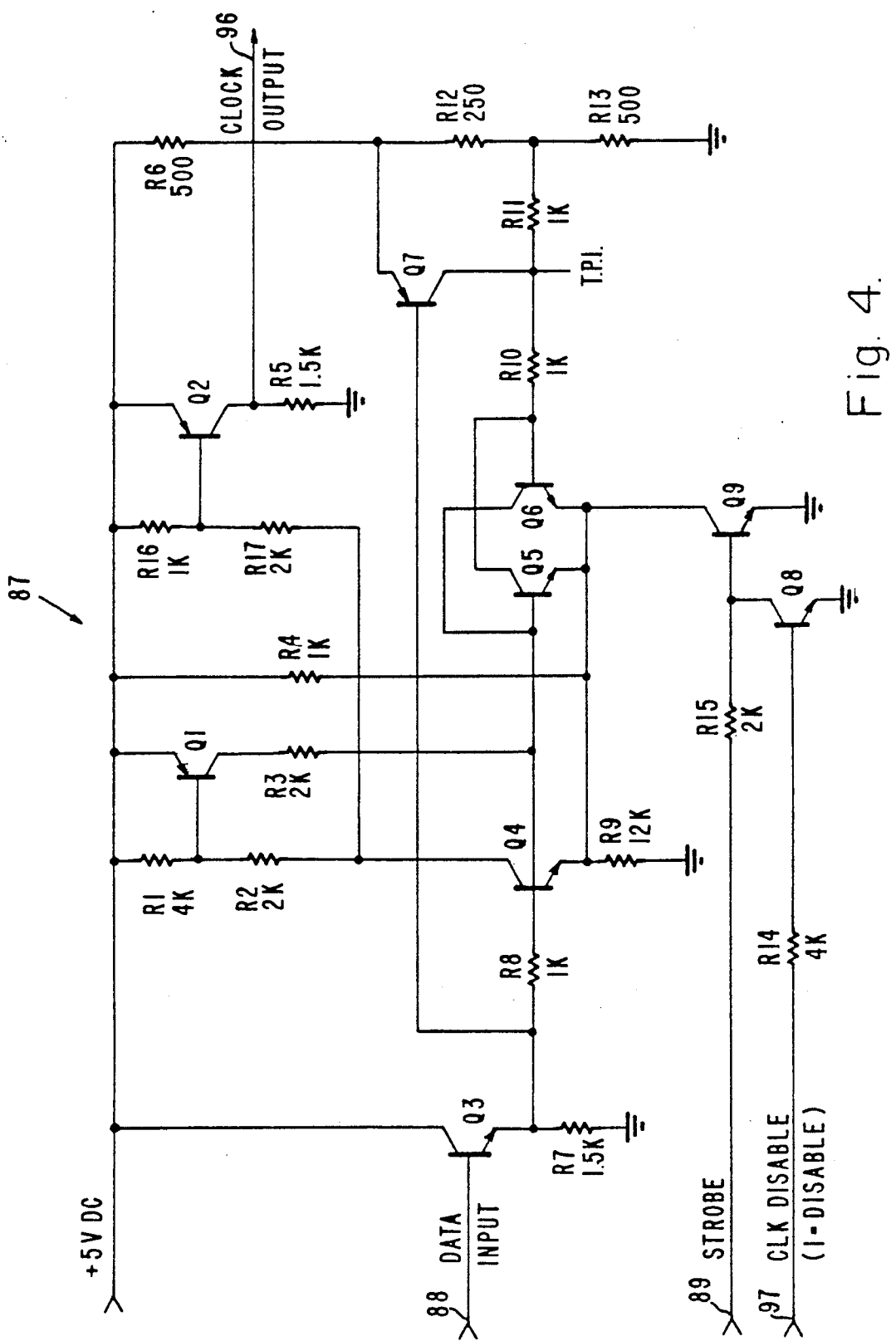
FIG. 4 is a detailed schematic diagram of the novel high-speed comparator shown as a functional block in FIG. 3.

Referring now to FIG. 4, novel high-speed comparator 87 used in the novel metastable-proof flip-flop according to the present invention is shown constructed of bipolar transistors and resistors.

Operation of comparator 87 is enabled by a positive-going strobe signal applied to strobe input terminal 89, which turns on NPN transistor Q9, provided that clock disable input terminal 97 is not high, in which latter case the base of Q9 would be pulled low by NPN transistor Q8 being turned on.

With transistor Q9 turned on during the high or active state of the strobe input signal, a ground return path is provided for NPN transistors Q4, Q5 and Q6. Transistors Q5 and Q6 are connected together as a differential amplifier pair, with regenerative feedback between the two transistor amplifiers being provided by cross-coupling the bases and collectors of the two transistors. A variable reference voltage is applied to the base of Q6 through a 1000-ohm resistor, R10. Input voltage to the differential amplifier pair Q5–Q6 is applied to the base of Q5 through a 1000-ohm resistor, R8. The input voltage is derived from data input terminal 88 of comparator 87, appearing at the emitter of an emitter follower amplifier consisting of NPN transistor Q3 and a 1.5K-ohm emitter resistor R7. The base of Q3 is connected to data input terminal 88 of comparator 87, and hence to sample-and-hold capacitor 75.

The floating reference voltage $V_{REF}$ at test point T.P.1, connected to the base of Q6 through R10, is maintained at a voltage in the approximate range of 2 to 2.8 volts, for a d.c. supply voltage of 5.0 volts. Reference voltage $V_{REF}$ varies because of the connection of the base of PNP transistor Q7 to the emitter of input emitter follower transistor Q3. The variable drive to the base of Q7 causes the collector of Q7 to send a variable positive current to the voltage divider consisting of R11, R12, R13, and R6 used to generate the reference voltage.

Thus, if the voltage at the emitter of Q3 rises approximately 2.2 volts or more above ground, the base and collector currents of Q7 decrease, lowering $V_{REF}$. In essence, the net effect of this action is to add positive loop gain to the differential comparison of data input voltage to $V_{REF}$, thus trading a wide range of voltage for a fast resolution in time. This trade-off increases the speed of response of the determination that the data input measured at the emitter of Q3 is above a one-threshold range of approximately 2.2 volts to 2.9 volts.

If the data input voltage at the emitter of Q3 exceeds $V_{REF}$ as described above, Q5 becomes substantially conducting while Q6 is substantially cut off. In addition, since the base and emitter of Q4 are connected to the base and emitter of Q5, respectively, Q4 becomes turned on in the approximate proportion as does Q5. Now, when a positive-going strobe pulse is applied to the base of Q9, the voltage at the collector of Q9 falls, pulling the emitters of Q4, Q5, and Q6 towards the zero volt level. Thus, as the collector of Q4 continues to drop in voltage below approximately 3.9 volts, the resistor network comprised of R2 and R1 develops a voltage at the base of Q1 that is sufficiently far below $V_{CC}$ level to turn Q1 on. Since Q4, Q1, and resistors R1, R2, and R3 comprise a regenerative latch network, turning on Q1 causes a progressive increase in drive current into the bases of Q4 and Q5, thus rapidly forcing Q4 towards a fully saturated condition. When the voltage at the collector of Q4 falls below a voltage of approximately 2.8 volts, Q2 will become turned on and continue into full saturation as the collector of Q4 falls to a final value of approximately 0.25 volts.

It is important to note that when Q4 first turns on and starts the regenerative action that will result in a fully latched end state, Q2 has not yet reached the point of turning on. This is due to the differences between the ½ ratio of resistors R2/R1 which drive Q1 and the 2/1 ratio R17/R16 which drive Q2, respectively. Thus, Q2 remains off until the latching action of Q4 and Q1, as described above, is well in progress. This is the means by which the high-speed comparator 87 is able to distinguish such a minute voltage differential without putting out any substantial noise in the case of a final output at the zero level. By the time that the collector of Q4 has fallen sufficiently low to turn Q2 on enough to start a positive swing at the collector of Q2, the regenerative loop described above has progressed beyond the point of being able to unlatch. Thus, Q2 will not start putting out a signal until the regenerative loop has irreversibly moved towards a fully latched state, even with the presence of noise on Vcc. Conversely, if the input voltage at the emitter of Q3 is not adequate to cause a complete switch to full output at the collector of Q2, the collector voltage of Q4 will rise back towards Vcc without having significantly turned Q2 on.

The above-described dynamic action causes the collector of Q2 to drive 1.5K-ohm resistor R5 to Vcc minus the saturation voltage of Q2 whenever the emitter of Q3 is sufficiently higher than $V_{REF}$. Thus, if Q5, Q4, Q1 and then Q2 are turned on as a result of a sufficient large positive voltage being applied to data input terminal 88 of comparator 87, a positive-going pulse occurs at output terminal 96 of the comparator.

The leading edge of the internal clock pulse output signal on output terminal 96 of comparator 87 occurs only a few nanoseconds after the leading edge of the strobe input pulse, which, as will be recalled, is a delayed replica of the external clock input pulse. Owing to the latching action of Q1 and Q4, as well as Q6 being cut off by conduction of Q5, the voltage level at clock output terminal 96 of comparator 87 will remain high until the emitter current return path of transistors Q5, Q6, and Q4 are interrupted by a one-to-zero transition at the strobe input terminal 89 of the comparator, which transition turns off Q9. Thus, any internal clock output pulse appearing at output terminal 96 of comparator 87 will have a trailing edge slightly delayed from the trailing edge of the external clock pulse.

High-speed comparator circuit 87 was thoroughly simulated with a version of the well-proven SPICE analog simulator program, available from the Infosoft, Inc. Company, San Pedro, Calif., on a 4-MIPS (million instructions per second) computer. Models of bipolar transistors were used that are consistent with those included in modern high-speed bipolar silicon integrated circuits. In the simulations, PNP transistors Q1, Q2 and Q7 had a nominal beta of 40 and a $F_t$ of 0.5.-1.1 GHZ. The NPN transistors Q3, Q4, Q5, Q6 Q8 and Q9 had a nominal beta of 50, and a $F_t$ of 1-2.5 GHZ.

Present state-of-the-art bipolar transistors used in Bi-CMOS integrated circuit chips are considerably slower than those used in the simulation, and would therefore produce longer propagation delays. Therefore, the fastest embodiments of the invention described herein would preferably be first implemented in all-bipolar integrated circuits where monolithic versions of the invention were desired. Alternatively, circuit embodiments in which the high-speed comparator is fabricated as one integrated circuit chip, and the remainder of the circuitry required for the invention fabricated as one or more CMOS integrated circuit chips, could be used until predicted advances in the state of Bi-CMOS art provide needed improvement in the speed of bipolar transistors used in Bi-CMOS devices.

It should be noted that the invention described herein is fully operable in embodiments using present state-of-the-art Bi-CMOS integrated circuits at clock rates consistent with their existing speed capabilities.

Results of thousands of passes through the SPICE circuit simulation program showed typical responses of the comparator producing a full output swing to the high state within 4 nanoseconds of the leading edge of the strobe pulse applied to strobe input 89 of the comparator. The maximum output delay seen was only 8 nanoseconds, even though the input signal was only 1 picovolt (1 times 10 to the −12 power) greater than a prior simulation in which the comparator output remained at logic zero.

In other words, after a given simulation was performed right at the "decision point" in which the output remained at logic zero, a subsequent simulation with the input to the comparator raised just one picovolt produced a solid output transition to the high state within a maximum of 8 nanoseconds. That transition speed would permit operation of the device at an external clock rate of approximately 40 MHZ. In addition, the maximum observed noise on the logic zero output of the comparator was less than 0.2 volts, even during simulations that were performed with +/−0.4 volts noise at 250 megahertz applied to the +5 volt supply terminal of the simulated circuit.

Referring back again to FIG. 3, flip-flop device 60 is seen to include an internal clock pulse generator 100. Internal clock pulse generator 100 has an input terminal 101 connected to internal clock output terminal 96 of comparator 87. Internal clock pulse generator 100 functions as a monostable multivibrator, or one shot, with an additional cascaded delay stage, as will be described later. Thus, internal clock pulse generator 100 produces a first zero-going pulse on a first output terminal 102, and an inverted first one-going pulse on a second output terminal 103, followed by a slightly delayed, second zero-going pulse on a third output terminal 104, and an inverted second one-going pulse on a fourth output terminal 105. These internal clock pulses are produced only if a zero-to-one transition occurs on output terminal 96 of comparator 87.

The monostable multivibrator, or one-shot pulse generator function of internal clock pulse generator 100 operates as follows. Referring to FIG. 3, it is seen that the input terminal 126 of an odd number of cascaded inverters I100-1 through I100-5 is connected to input terminal 101 of the internal clock pulse generator 100. The output terminal 127 of the last inverter 100-5 of the aforementioned cascaded inverter chain is connected to a first input terminal 128 of a two-input nand gate N100-1. A second input terminal 129 of nand gate N100-1 is connected to input terminal 101 of clock pulse generator 100.

In the absence of a positive clock output pulse on output terminal 96 of comparator 87, which terminal is connected to input terminal 101 of clock pulse generator 100, the logic levels of both input terminal 126 of inverter I100-1 and input terminal 129 of inverter N100-1 are low. Thus, at this time output terminal 130 of nand gate N100-1 is high, and output terminal 127 of inverter I100-5 which is connected to second input terminal 128 of nand gate N100-1, is also high. Now, when a one-going clock pulse occurs on output terminal 96 of high-speed comparator 87 and input terminal 101 of clock generator 100, both input terminal 129 and input terminal 128 of nand gate N100-1 are at logic one levels, causing the output terminal 130 of nand gate N100-1 to experience a one-to-zero transition.

After a period of time equal to the sum of the gate propagation delays of the odd number of inverters I100-1 through I100-5, the zero-to-one transition at input terminal 126 of inverter I100-1 results in a one-to-zero level change at output terminal 127 of inverter I100-5. Since the latter output terminal is connected to input terminal 128 of nand gate N100-1, the delayed one-to-zero transition level change at output terminal 127 of inverter I100-5 causes output terminal 130 of nand gate N100-1 to experience a zero-to-one transition, and to remain at a one level. Thus, inverters I100-1 through I100-5 in combination with nand gate N100-1, function as one-shot, producing a short internal clock pulse at output terminal 102 of internal clock pulse generator 100. The width of this internal clock pulse, which is determined by the cumulative gate propagation delays of inverters I100-1 through I100-5, is much less than the minimum width of the one-going output pulse at output terminal 96 of comparator 87.

After the end of the internal clock pulse at output terminal 102, described above, the positive output pulse from comparator 87 continues propagating through inverters I100-6 through I100-8 and nand gate N100-2 to initiate delayed internal clock pulses at output terminals 104 and 105 of the internal clock pulse generator 1100. These latter pulses are terminated by the falling edge of the pulse on output terminal 96 of comparator 87.

The first, zero-going output terminal 102 of internal clock pulse generator 100 is connected to the "latch" clock input terminal 107 of a flip-flop 106 referred to as a data flip-flop. The second, positive going output terminal 103 of internal clock pulse generator 100 is connected to the "copy" clock input terminal 108 of data flip-flop 106. Thus, in a quiescent state prior to the occurrence of internal clock pulses, data flip-flop 106 is in a latched state.

When the first zero-going internal clock pulse at the latch clock input 107 of data flip-flop 106 occurs, latch transmission gate TG1 is turned off and input transmission gate TG2 of the data flip-flop is turned on. This allows a logic level at the data input terminal 109 of data flip-flop 106 to be copied into it. At the end of the first internally generated clock pulse, output terminal 103 of internal clock pulse generator 100 and connected copy clock input terminal 108 of data flip-flop 106 experience a one-to-zero transition, turning TG1 on and turning TG2 off, and thus latching the logic level at input terminal 109 of data flip-flop 106 into the flip-flop.

After a time delay equal to the sum of the propagation delays of inverters I100-6, 7 and 8 and nand gate N100-2, a second, delayed zero-going output pulse occurs at output terminal 104 of internal clock pulse generator 100. Output terminal 104 is connected to the latch clock input terminal 121 of a "track" flip-flop 70. The delayed one-going output terminal 105 of internal clock pulse generator 100 is connected to the copy clock input terminal 122 of track flip-flop 70. Thus, the delayed zero-going internal clock pulse at delayed clock pulse output terminal 104 of the internal clock pulse generator 100 turns latch transmission gate TG3 of track flip-flop 70 off, and turns input transmission gate TG4 of the track flip-flop on. Since the internal Q data output terminal 123 of data flip-flop 106 is connected to the data input terminal 124 of track flip-flop 70, the logic state of the data flip-flop is copied into the track flip-flop at this time. At the end of the delayed zero-going internal clock pulse on output terminal 104 of internal clock pulse generator 100, the delayed one-going pulse occurring at output terminal 105 of the internal clock pulse generator, which output terminal is connected to copy clock input terminal 122 of track flip-flop 70, experiences a one-to-zero logic level transition. With copy clock input terminal 122 of track flip-flop 70 low, input gate TG4 is turned off and latch transmission gate TG3 is turned on, thus latching the logic level of the data flip-flop 106 into the track flip-flop.

As shown in FIG. 3, the inverted data ($\overline{QT}$) output terminal 125 of track flip-flop 70 is connected to data input terminal 109 of data flip-flop 106. Therefore, when the first internal clock pulse occurs at output terminals 102 and 103 of internal clock pulse generator 100, the inverted logic state of track flip-flop 70 is clocked into the data flip-flop. Since the delayed internal clock pulse which was generated in the last previous internal clock pulse sequence copies the contents of data flip-flop 106 into track flip-flop 70, the net result of the generation of an internal clock pulse sequence is to toggle, or change the state of, data flip-flop 106.

As was previously discussed, Q data output terminal 71 of track flip-flop 70 is connected to one input terminal 69 of XOR gate 67. Also, data input terminal 61 of the metastable-proof flip-flop 60 is connected to the other input terminal 68 of XOR gate 67. Therefore, if a logic level different from the level stored in track flip-flop 70 is present on data input terminal 61, which logic level is above or below logic one or zero threshold levels, respectively, and is present sufficiently far in advance of an active transition of the external clock signal applied to clock input terminal 62 of flip-flop 60, an internal clock pulse sequence will be generated by internal clock pulse generator 100. If an internal clock pulse sequence is thus generated, data flip-flop 106 and track flip-flop 70 will each toggle, or change logic state. Thus, data output terminals 63 and 64 of flip-flop device 60 will also toggle.

If input terminal 61 of flip-flop device 60 is at the same logic level as that previously stored in data flip-flop 106 and track flip-flop 70, when an active external clock transition occurs, or if the signal level at the input terminal does not at least partially meet timing or threshold level requirements as stated above, no internal clock pulse sequence will be generated, leaving the logic state of flip-flop device 60 unchanged. Thus, the novel metastable-proof flip-flop device 60 according to the present invention is absolutely free of any possible metastable states.

Figure 5:
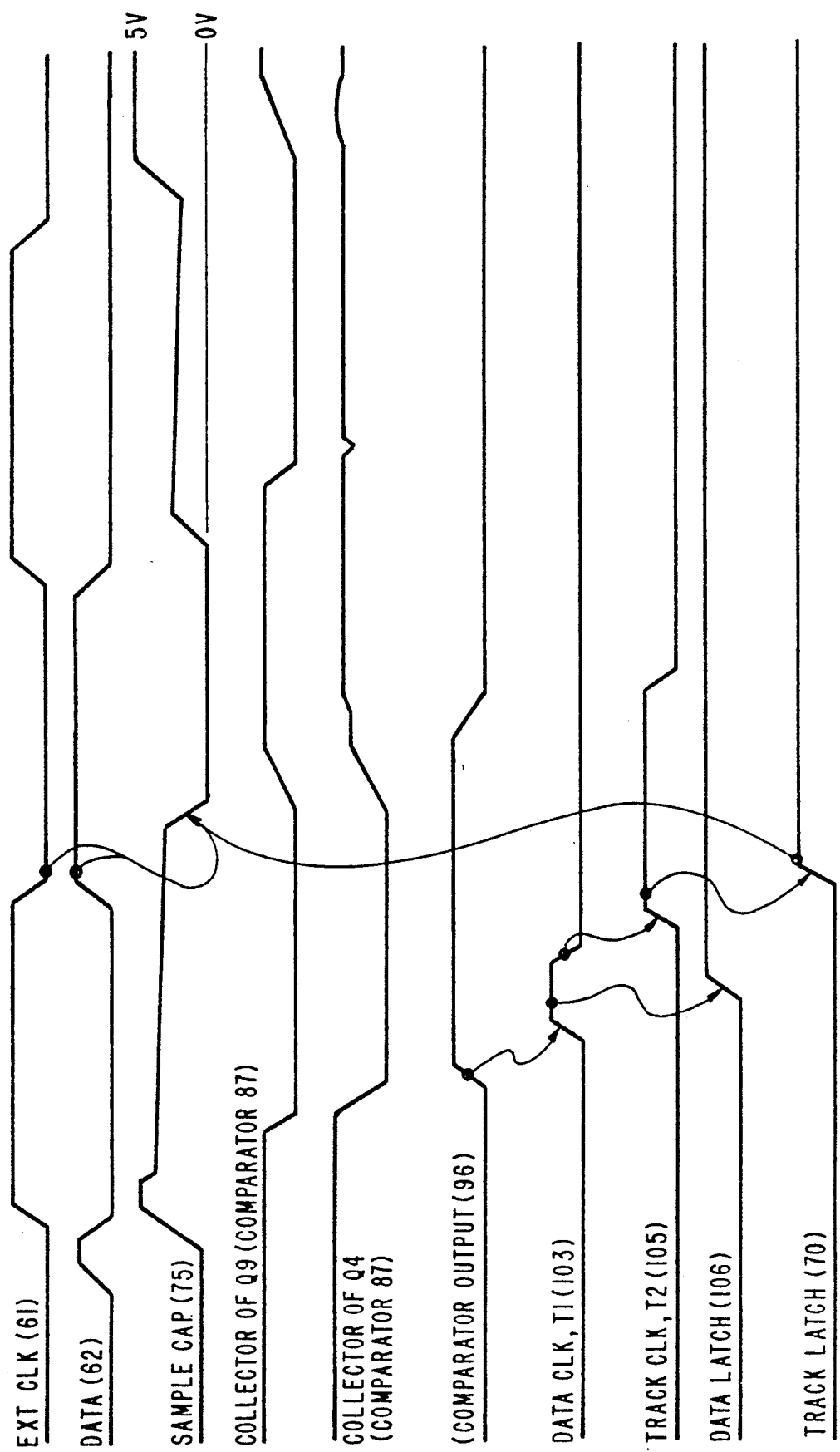
FIG. 5 is a timing diagram showing time relationships between key voltage waveforms of the flip-flop device of FIG. 3.

FIG. 5 is a timing diagram showing waveforms and time relationships of signal levels of the circuits shown in FIGS. 3 and 4.

Figure 6:
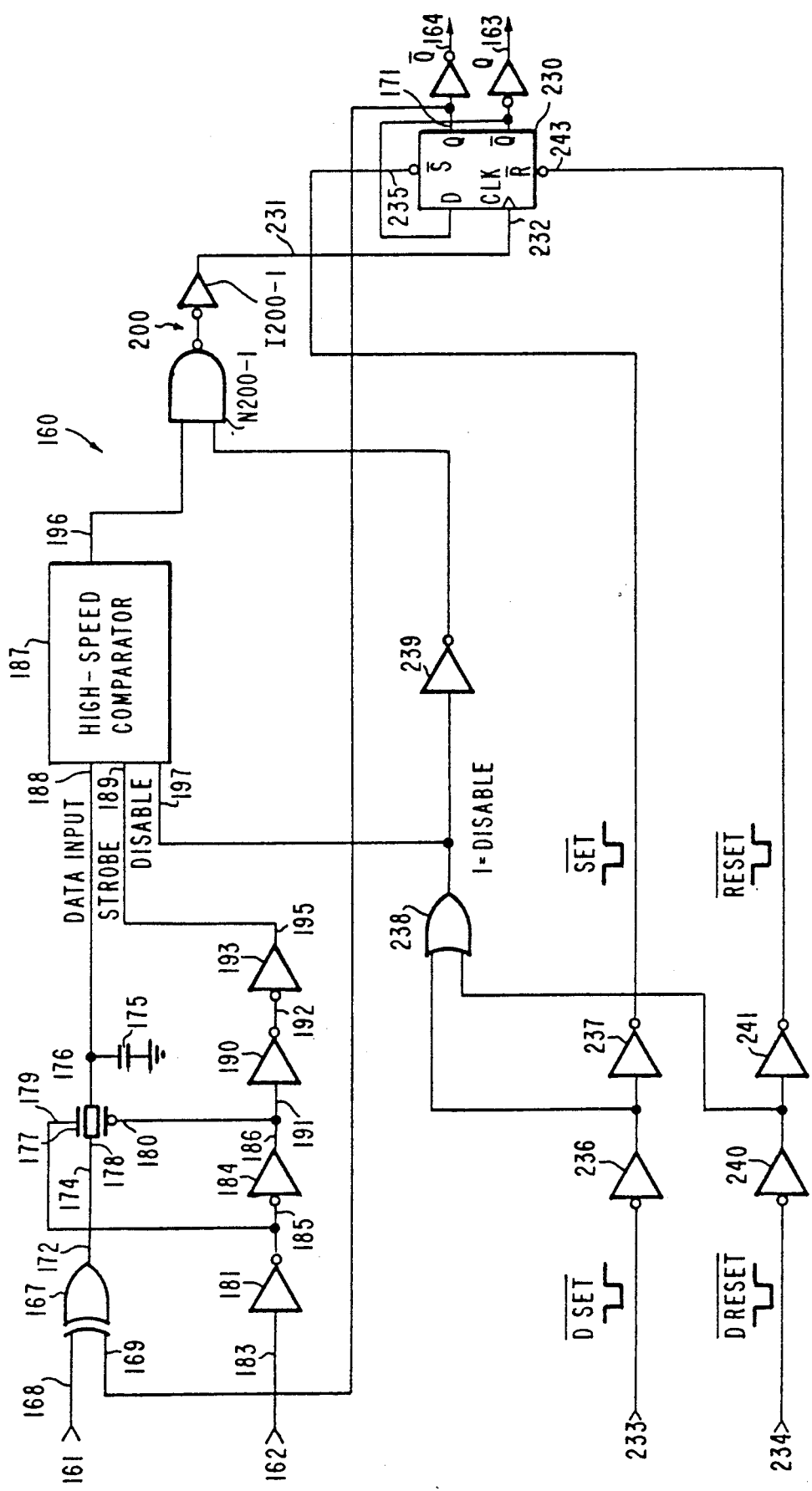
FIG. 6 is a schematic diagram of another embodiment of the novel flip-flop device of FIG. 2.

FIG. 6 illustrates in schematic form an alternate embodiment of a metastable-proof flip-flop according to the present invention.

The alternate embodiment 160 of a metastable-proof flip-flop device according to the present invention as shown in FIG. 6, is a somewhat simplified variation of the basic embodiment 60 depicted in FIG. 3 and described above. The basic structure and function of the alternate embodiment 160 are substantially similar to that of the basic embodiment. Therefore, the description of alternate embodiment 160 which follows will be primarily one of the differences between the alternate embodiment and the previously described basic embodiment 60.

As shown in FIG. 6, track flip-flop 70 and data flip-flop 106 of the basic embodiment are replaced by the master and slave sections, respectively, of a standard, clocked D-type flip-flop 230. The $\overline{Q}$ output of flip-flop 230 is connected to its D input, thus configuring the flip-flop as a toggle flip-flop. Also, internal clock pulse generator 100 of the basic embodiment 60 shown in FIG. 3 is replaced by a simpler, single-pulse internal clock pulse generator 200, consisting of a two-input nand gate N200-1 and an inverter I200-1. The combination of nand gate N200-1 and inverter I200-1 function together to gate through a complete output pulse on the output terminal 196 of high-speed comparator 187 as the sole internal clock pulse required to clock flip-flop 230. This clock pulse occurs on output terminal 231 of inverter I200-1 which is connected to the clock input terminal 232 of flip-flop 230. Internal clock pulses on output terminal 231 of inverter I200-1 are inhibited from occurring if a direct set or reset pulse is applied to flip-flop device 160, as will be described below.

As shown in FIG. 6, alternate embodiment 160 of the metastable-proof flip-flop device is provided with an inverted direct set input terminal 233 and an inverted direct reset input terminal 234. A logic zero level signal on terminal 233 or 234 will force flip-flop 230 into a logic one or logic zero level, respectively.

Inverted direct set input terminal 233 is connected to inverted set input terminal 235 of flip-flop 230 through cascaded inverters 236 and 237. Thus, when a zero-going set pulse occurs on input terminal 233 of flip-flop device 160, a zero-going pulse also occurs on the inverted direct set input terminal 235 of flip-flop 230, setting the output terminal 163 of flip-flop 160 to a logic one state.

The output terminal of inverter 236 is also connected to an input terminal of a two-input OR gate 238. The output terminal of OR gate 238 is connected to the disable input terminal 197 of high-speed comparator 187. Thus, during the period that a logic zero inverted set pulse is present on input terminal 233, the output terminal of inverter 236, input terminal of OR gate 238, output terminal of the OR gate, and clock disable input terminal 197 of comparator 187 are all at a logic high level, inhibiting operation of the comparator. Thus, generation of an internal clock pulse is inhibited during a direct set input pulse.

The output terminal of OR gate 238 is also connected to the input terminal of an inverter 239, whose output terminal is connected to an input terminal of nand gate N200-1. Thus, while a direct set pulse is present, nand gate N200-1 is inhibited from outputting a clock signal. This assures that any previously generated internal clock pulse which might have been generated by comparator 187 prior to the occurrence of a clock disable signal will be terminated, i.e., brought to a logic zero level, prior to the time that the direct set signal applied to terminal 235 of flip-flop 230 goes to an inactive state. Consequently, even if an internal clock pulse is present at the time an external direct set pulse is applied to flip-flop device 160, the end state of flip-flop 230 will be determined solely by the external set or reset pulse level. The direct set or reset pulse must be present until after the inactive edge of the external clock input pulse to prevent the recurrence of a new output from the comparator during the same clock cycle in which the set/reset function was performed.

As shown in FIG. 6, inverted direct reset input terminal 234 of flip-flop device 160 is connected to inverted reset input terminal 243 of flip-flop 230 through cascaded inverters 240 and 241. Thus, in a manner exactly analogous to the direct setting action described above, applying a zero-going inverted direct reset pulse to input terminal 234 of flip-flop 160 forces the flip-flop into a reset state. Also, the output terminal of inverter 240 is connected to the second input terminal 238 of OR gate 238. Thus, operation of the internal clock pulse generator is also inhibited during the occurrence of a direct reset pulse, in a manner exactly analogous to the inhibiting action during a direct set pulse, as described above.

Those skilled in the art of digital logic design will understand that the novel circuits described in the foregoing specification and claimed below could equally well employ a negative logic convention without departing from the spirit of the invention. Thus, for example, where the output level of an EXCLUSIVE OR gate or other logic element is specified to make a zero-to-one, or zero volt to five volt transition, a negative logic implementation of the invention could equally well employ an EXCLUSIVE NOR gate whose output terminal makes a five-volt-to-zero-volt transition when the logic states of the input terminals of the device differ from one another. Also, it would be a matter of ordinary design choice to construct versions of the present invention in which non-inverting logic elements are substituted for inverting elements, and vice versa.

What is claimed is:

1. A method for storing digital data in a clocked electronic bistable device of the type having a data input terminal, a clock input terminal and a data output terminal, said method providing immunity from metastability, and comprising:
   (a) storing a voltage level proportional to a voltage level at the data input terminal of said bistable device in a voltage storage means,
   (b) operably disconnecting said voltage storage means from the influence of said voltage level at said data input terminal after occurrence of an active transition of an external clock input signal on said clock input terminal,
   (c) comparing said stored voltage level held in said voltage storage means with a predetermined threshold range, which, if exceeded, causes generation of a full amplitude digital logic level, and
   (d) using said full amplitude digital logic level to update said data output terminal of said bistable device to that logic state which represents said voltage level which existed at sadi data input terminal at the time of siad active transition of siad external clock input terminal.

2. A method for storing digital data in a clocked electronic bistable device of the type having a data input terminal, a clock input terminal, and a data output terminal said method providing immunity from metastability, and comprising;
   (a) passing a voltage level at said data input terminal of said bistable device through a combinational logic means which produces a voltage output representing the EXCLUSIVE OR combination of said voltage level at said data input terminal and the logic state of said data output terminal of said bistable device,
   (b) storing said voltage output of said combinational logic means as a voltage level in a voltage storage means,
   (c) operably disconnecting said voltage storage means from the influence of said voltage output of said combinational logic means after occurrence of an active transition of an external clock input signal on said clock input terminal,
   (d) comparing said storied vantage level held in said voltage storage means with a predetermined threshold range, which, if exceeded, causes generation of a full amplitude digital logic level, and
   (d) using said full amplitude digital logic level to update said data output terminal of said bistable device to that logic level which existed at said data input terminal at the time of said active transition of said external clock input signal.

3. A method according to claim 2 wherein the process of updating said bistable device is further defined as including the steps of;
(a) generating an internal clock pulse if and only if said full amplitude digital logic level is a predetermined logic level which indicates that the voltage at the data input terminal of said bistable device represented the logic level that is the complement of the logic state of said bistable device at the time of said active transition of said external clock input signal, and
(b) using said internal clock pulse, if generated, to cause said bistable device to toggle to the opposite state.

4. An improved electronic flip-flop device for storing a one or zero logic level synchronously with an external clock signal, said device having a data input terminal, an external clock input terminal and a data output terminal, said device having a novel circuit architecture causing said device to be free from intermediate or metastable output levels on said data output terminal and comprising;
(a) a first, data, bistable storage element (bistable) having an input terminal, and an output terminal connected to said output terminal of said device,
(b) a second, track, bistable having an input terminal connected to said output terminal of said first, data bistable, and having a first data output terminal and a second, complementary data output terminal, said complementary data output terminal being connected to said input terminal of said first, data bistable,
(c) a polarizing circuit having an output terminal, a first input terminal connected to said data input terminal of said device and a second input terminal connected to said data output terminal of said track bistable, said polarizing circuit being characterized by outputting a logic one level on its output terminal only if the logic levels on said first and second input terminals of said polarizing circuit differ in polarity,
(d) st having an input terminal connected to said output terminal of said polarizing circuit, an output terminal, and a gate input terminal, said storage means being adapted to retain a signal level proportional to the signal level of said output terminal of said polarizing circuit,
(e) a comparator having a data input terminal connected to the output terminal of said storage means, a strobe input terminal, and an output terminal, said comparator adapted to produce at its output terminal a logic level change only if the level at said data input terminal exceeds a minimum threshold range, and said comparator producing no logic level change at its output terminal in the absence of a signal at said input data terminal of said comparator which exceeds said threshold range,
(f) an internal clock pulse generator for clocking said data and track bistables, said internal clock pulse generator having an input terminal connected to said output terminal of said comparator, and said internal clock pulse generator having at least one clock pulse output terminal connected to clock input terminals of said data and tracking bistables, respectively, said internal clock pulse generator producing at said internal clock pulse output terminal an internal clock pulse only if a logic level transition occurs at said output terminal of said comparator and at said data input terminal of said internal clock pulse generator, and
(g) timing pulse means connected to said external clock input terminal of said device for producing timing signals applied to said storage means and to said comparator, whereby, during the inactive state of an external clock pulse, said storage means stores a level proportional to the output signal at the output terminal of said polarizing circuit, and during the active state of said external clock pulse, said storage means is operably disconnected from said data polarizing circuit and operably connected to said comparator, said comparator producing a logic level transition if said level of said storage means exceeds said threshold range, said logic level transition producing an internal clock pulse which toggles said data bistable to a logic state different from its state prior to the occurrence of said internal clock pulse sequence, and said internal clock pulse, causing said track bistable to copy said new logic state of said data bistable.

5. The device of claim 4 wherein said polarizing circuit is an EXCLUSIVE OR gate.

6. The device of claim 4 wherein said storage means is a sample-and-hold circuit.

7. The device of claim 4 wherein said internal clock pulse generator is further defined as comprising a cascaded pair of monostable multivibrators (one-shots).

8. The device of claim 4 wherein said first bistable is further defined as being one section of a master-slave flip-flop.

9. The device of claim 4 wherein said second bistable is further defined as being a one section of a master-slave flip-flop.

10. The device of claim 4 wherein said timing pulse means is further defined as comprising a series of cascaded logic gates having an input terminal connected to said external clock input terminal and first and second output terminals connected to said storage means and said comparator, respectively.

11. The device of claim 4 wherein said comparator is further defined as comprising; (a) an input buffer amplifier having an input terminal connected to said data input terminal of said comparator, and an output terminal,
(b) a differential amplifier having a first input terminal connected to said output terminal of said input buffer amplifier, a second input terminal connected to a reference voltage source, and an output terminal, said differential amplifier including first and second internal amplifying elements regeneratively coupled to one another,
(c) a positive feedback amplifier, said positive feedback amplifier having an output terminal connected to said reference source and an input terminal connected to said output terminal of said input buffer amplifier, whereby a positive signal at said input buffer amplifier decreases said reference level, thereby further aiding the regenerative action and speed enhancement of said differential amplifier,
(d) a latching amplifier having a first input terminal connected to said output terminal of said input buffer amplifier, a second input terminal connected to said output terminal of said differential amplifier, and an output terminal, (e) an output amplifier having an output terminal constituting the output terminal of said comparator and an input terminal, and (f) a thresholding means connected between said input terminal of said output amplifier and said output terminal of said latching amplifier, said thresholding means being effective in preventing the voltage level at said output terminal of said output amplifier from exceeding a logic zero level until and unless said latching amplifier fully latches in response to a sufficiently large positive signal level at said data input terminal of said comparator.

12. An improved electronic flip-flop device having a data input terminal, an external clock input terminal, and a data output terminal, said flip-flop device comprising;

(a) a first, data, flip-flop having a clock input terminal, a data input terminal, and an output terminal comprising said output terminal of said device, (b) a second, track flip-flop having a clock input terminal, a data input terminal connected to said data output terminal of said data flip-flop, and an output terminal, (c) an EXCLUSIVE OR gate having an output terminal, a first input terminal connected to said data input terminal of said device and a second input terminal connected to said data output terminal of said track flip-flop, (d) a sample-and-hold circuit having an input terminal connected to said output terminal of said EXCLUSIVE OR gate, an output terminal, and a gate input terminal, (e) a high-speed comparator having a data input terminal connected to the output terminal of said sample-and-hold circuit, an da strobe input terminal, said comparator producing at its output terminal in response to a strobe input signal appearing on said strobe input terminal a logic level change only if the level at said data input terminal exceeds a minimum threshold range, and said comparator producing no logic level change at its output terminal in the absence of a strobe input signal or in the absence of a signal at said data input terminal of said comparator which exceeds said threshold range, (f) an internal clock pulse generator for producing an internal clock pulse, said internal clock pulse generator having an input terminal connected to said output terminal of said comparator, and said internal clock pulse generator having at least one internal clock pulse output terminal connected to said clock input terminals of said data and tracking flip-flops, respectively, said internal clock pulse generator producing at said internal clock pulse output terminal an internal clock pulse only if a logic level transition occurs at said output terminal of said comparator and at said data input terminal of said internal clock pulse generator, said internal clock pulse first toggling the logic state of said data flip-flop and then copying the new logic state of said data flip-flop into said track flip-flop, and (g) a timing pulse generator having an input terminal connected to said external clock input terminal of said device, said timing pulse generator having a first output terminal connected to said gate input terminal of said sample-and-hold circuit, and a second output terminal connected to said strobe input terminal of said comparator, said timing pulse generator producing a first timing pulse delayed from said external clock pulse for disconnecting said sample-and-hold circuit from said EXCLUSIVE OR gate, and a second timing pulse delayed from said first timing pulse for enabling said comparator.

13. The device of claim 12 wherein said internal clock pulse generator is further defined as having means for producing a sequence of internal clock pulses, said internal clock pulse generator having a first internal clock pulse output terminal connected to said clock input terminal of said data flip-flop, and a second, delayed internal clock pulse output terminal connected to said clock input terminal of said track flip-flop.

14. The device of claim 12 wherein said data flip-flop and said track flip-flop comprise, respectively, the master latch and slave latch of a master/slave flip-flop configured as a toggle flip-flop.

15. A high speed comparator circuit having an input data terminal and an output terminal for producing a logic level change at said output terminal if the input signal level at said input terminal exceeds a pre-determined threshold range, and an output level below a logic zero threshold if said input level is below said threshold range, said comparator comprising, (a) an input buffer amplifier having an input terminal connected to said data input terminal of said comparator, and an output terminal, (b) a differential amplifier having a first input terminal connected to said output terminal of said input buffer amplifier, a second input terminal connected to a reference voltage source, and an output terminal, said differential amplifier including first and second internal amplifying elements regeneratively coupled to one another, (c) a positive feedback amplifier, said positive feedback amplifier having an output terminal connected to said reference source and an input terminal connected to said output terminal of said input buffer amplifier, whereby a positive signal at said input buffer amplifier decreases said reference level, thereby further aiding the regenerative action and speed enhancement of said differential amplifier, (d) a latching amplifier having a first input terminal connected to said output terminal of said input buffer amplifier, a second input terminal connected to said output terminal of said differential amplifier, and an output terminal, (e) an output amplifier having an output terminal constituting the output terminal of said comparator and an input terminal, and (f) a thresholding means connected between said input terminal of said output amplifier and said output terminal of said latching amplifier, said thresholding means being effective in preventing the voltage level at said output terminal of said output amplifier from exceeding a logic zero level until and unless said latching amplifier fully latches in response to a sufficiently large positive signal level at said data input terminal of said comparator.

* * * * *